(12) United States Patent
Lane

(10) Patent No.: US 7,157,761 B2
(45) Date of Patent: Jan. 2, 2007

(54) CAPACITOR WITH NOBLE METAL PATTERN

(75) Inventor: Richard H. Lane, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 13 days.

(21) Appl. No.: 10/117,101

(22) Filed: Apr. 8, 2002

(65) Prior Publication Data

US 2002/0115231 A1    Aug. 22, 2002

Related U.S. Application Data

(62) Division of application No. 09/639,088, filed on Aug. 16, 2000, now Pat. No. 6,475,911.

(51) Int. Cl.
*H01L 21/8238* (2006.01)
(52) U.S. Cl. ...................... 257/296; 257/300
(58) Field of Classification Search ............... 257/303, 257/296, 306, 298, 300, 310, 295, 771, 309, 257/66, 200; 438/686, 396, 682, 584, 253
See application file for complete search history.

(56) References Cited

U.S. PATENT DOCUMENTS

| | | | |
|---|---|---|---|
| 4,453,306 A | 6/1984 | Lynch et al. | |
| 4,470,189 A | 9/1984 | Roberts et al. | |
| 5,053,105 A | 10/1991 | Fox, III | |
| 5,452,178 A * | 9/1995 | Emesh et al. ................. | 361/303 |
| 5,624,871 A | 4/1997 | Teo et al. | |
| 5,625,233 A * | 4/1997 | Cabral et al. ................. | 257/771 |
| 5,696,017 A | 12/1997 | Ueno | |
| 5,705,438 A * | 1/1998 | Tseng ........................... | 438/238 |
| 5,723,171 A * | 3/1998 | Cuchiaro et al. ............ | 257/295 |
| 5,789,323 A | 8/1998 | Taylor | |
| 5,834,356 A | 11/1998 | Bothra et al. | |
| 5,877,062 A * | 3/1999 | Horii ............................ | 438/396 |
| 5,930,618 A | 7/1999 | Sun et al. | |
| 5,930,639 A | 7/1999 | Schuele et al. | |
| 5,972,790 A | 10/1999 | Arena et al. | |
| 6,001,660 A | 12/1999 | Park et al. | |
| 6,015,989 A | 1/2000 | Horikawa et al. | |
| 6,043,536 A | 3/2000 | Numata et al. | |
| 6,096,643 A | 8/2000 | Nariman et al. | |
| 6,136,659 A * | 10/2000 | Schindler et al. ............ | 438/386 |
| 6,211,016 B1 | 4/2001 | Wu | |
| 6,228,730 B1* | 5/2001 | Chen et al. ................... | 438/301 |
| 6,235,630 B1 | 5/2001 | Akram et al. | |
| 6,297,527 B1* | 10/2001 | Agarwal et al. .............. | 257/306 |
| 6,335,557 B1* | 1/2002 | Kizilyalli et al. ............ | 257/532 |
| 6,342,712 B1* | 1/2002 | Miki et al. ................... | 257/295 |
| 6,372,574 B1* | 4/2002 | Lane et al. ................... | 438/253 |
| 6,395,590 B1* | 5/2002 | Leu .............................. | 438/186 |
| 6,447,838 B1* | 9/2002 | Azuma et al. ................ | 427/80 |
| 6,448,603 B1* | 9/2002 | Gonzalez ..................... | 257/306 |
| 6,573,542 B1* | 6/2003 | Bruchhaus et al. .......... | 257/295 |

* cited by examiner

*Primary Examiner*—Howard Weiss
*Assistant Examiner*—(Vikki) Hoa B. Trinh
(74) *Attorney, Agent, or Firm*—Dickstein Shapiro LLP

(57) ABSTRACT

An intermediate product for an integrated circuit is disclosed. The intermediate product comprises a first portion of a conductive layer, preferably a layer of noble metal, which will form an upper electrode of a capacitor or a patterned wiring. The intermediate product also comprises an adjacent second portion of the conductive layer, the second portion being a removable silicide of the conductive layer.

19 Claims, 6 Drawing Sheets

CAPACITOR WITH NOBLE METAL PATTERN

This application is a divisional of application Ser. No. 09/639,088, filed on Aug. 16, 2000 now U.S. Pat. No. 6,475,911, which is incorporated herein by reference.

FIELD OF THE INVENTION

The present invention relates to the field of semiconductor industry and, in particular, to a method of patterning noble metals for use in semiconductor devices such as capacitors.

BACKGROUND OF THE INVENTION

As the overall dimensions of semiconductor devices continue to decrease, the demand for devices which can be patterned with high-resolution continues to increase. The need for smaller surface area available for components, such as capacitors or transistors, along with the requirement to maintain high-reliability electrical connections, have led researchers in the semiconductor field to seek new materials for such components.

For example, promising candidates for the upper electrode materials for capacitor electrodes in integrated circuit (IC) memory structures include the eight noble metals (platinum (Pt), palladium (Pd), iridium (Ir), ruthenium (Ru), rhodium (Rh), osmium (Os), silver (Ag) and gold (Au)), as well as their oxides (for example, ruthenium oxide ($RuO_2$), iridium oxide ($IrO_2$) or osmium oxide ($OsO_2$), among others). The above-mentioned noble metals, of which platinum (Pt) is the most common, are all physically and chemically similar. They are also rather stable, or capable of forming conductive oxides (so the capacitance remains unchanged) in oxidizing, reducing, or inert atmospheres at high temperatures. These metals are also resistant to hydrogen damage, and do not affect the dielectric polarization after annealing at high temperatures.

Recently, particular attention has been accorded to platinum (Pt) mainly because platinum has a very low reactivity and is inert to oxidation, thus preventing oxidation of electrodes which would further decrease the capacitance of storage capacitors. Platinum also has a leakage current lower than that of other electrode materials, for example ruthenium oxide or polysilicon, as well as a high electrical conductivity. Further, platinum is known to have a notably high work function. The work function is an important feature of a DRAM electrode material and, when quantified, it denotes the energy required to remove one electron from the metal. Advanced DRAM cells are characterized by a dominant leakage mechanism, known as the Schottky emission from metal into the dielectric, so that metals, like platinum, with high work function produce less leakage.

The use of platinum as the material of choice for upper capacitor electrodes poses, however, significant problems. One of them arises from the difficulty of etching and/or polishing of platinum and the corresponding need to precisely etch the platinum into the shape of the desired capacitor electrode. The etching process, which is repeated many times in the formation of IC chips, typically employs at least one chemical etchant which reacts with, and removes, the film or layer that is etched. Noble metals, such as platinum, however, are not highly reactive with such chemical etchants and, consequently, noble metals require specialized etching methods and/or highly-reactive chemical etchants.

Two methods are currently used for platinum etching. The first method is an isotropic etching, such as wet etching with aqua regia (mix ratio of concentrated hydrochloric acid: concentrated nitric acid: water=3:1:4), that offers a very low grade of precision. Consequently, such wet etching is not accurate enough for the fine pattern processing, rendering it difficult to perform submicron patterning of platinum electrodes.

The second method is an anisotropic etching, such as the ion beam etching process, under which ions, such as argon, generated by a magnetically confined RF or DC plasma bombard an exposed platinum surface. While the ion etching process is used to define and form high resolution patterns from a blanket platinum layer, this process is typically not selective to many masking materials as well as to the layers underlying the platinum layer. Further, the ion etching process removes most materials at about the same rate, making control of process very difficult.

A further problem with the anisotropic etching of noble metals is that, during the etching process, the photoresist material, which typically masks the noble metal layer, is also etched at a substantial rate, along with the noble metal. This causes the sides of the photoresist mask to shrink and, as a result, the underlying features which were intended to be masked are etched beyond their intended critical dimension. As a consequence, capacitor electrodes, for example, are spaced further apart than desired. This is turn affects the device density on the integrated circuit, which in turn decreases the number of chips to be fabricated on a single wafer.

Accordingly, there is a need for an improved method of patterning of noble metals, such as platinum, during the formation of IC components, such as capacitors or transistors. There is also a need for high-resolution patterning of a noble metal layer during the formation of an upper capacitor electrode, as well as a method for increasing processing accuracy in etching such noble metal.

SUMMARY OF THE INVENTION

The present invention provides a method for the selective removal of portions of a noble metal layer employed in the formation of various semiconductor devices, such as capacitors, as well as a method for increasing processing accuracy in etching such noble metals.

In an exemplary embodiment, a layer of noble metal, which will form an upper electrode of a capacitor, is first formed over a dielectric layer. A mask layer is then deposited over the noble metal layer. The mask layer is then patterned to leave a portion of the noble metal layer exposed. The portion of the exposed noble metal is subsequently converted to its silicide, the noble metal silicide is then etched and the insulating layer is removed, leaving the noble metal layer patterned in a conventional upper electrode of an IC capacitor. In a preferred embodiment, platinum (Pt) is used for the upper electrode.

Additional advantages of the present invention will be more apparent from the detailed description and accompanying drawings, which illustrate preferred embodiments of the invention.

DETAILED DESCRIPTION OF THE PREFERRED EMBODIMENTS

In the following detailed description, reference is made to various specific embodiments in which the invention may be practiced. These embodiments are described with sufficient detail to enable those skilled in the art to practice the invention, and it is to be understood that other embodiments may be employed, and that structural, logical, and electrical changes may be made without departing from the spirit or scope of the present invention.

The term "substrate" used in the following description may include any semiconductor-based structure that has an exposed silicon surface. Structure must be understood to include silicon, silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to substrate in the following description, previous process steps may have been utilized to form regions or junctions in or on the base semiconductor or foundation.

The term "noble metal" is intended to include not only elemental noble metal, but noble metal with other trace metals or in various alloyed combinations with other metals as known in the semiconductor art, as long as such alloy retains the physical and chemical properties of the noble metal. The term "noble metal" is also intended to include oxides of such noble metals.

The present invention provides a method for patterning of noble metals, such as platinum, during the formation of IC components, such as capacitors or wiring patterns. The invention converts portions of the noble metal layer to its silicide, followed by removal of the noble metal silicide, to leave various patterned geometric features of semiconductor memory devices, such as an upper capacitor electrode. The method of the present invention also increases the processing accuracy in patterning noble metals.

Figure 1:
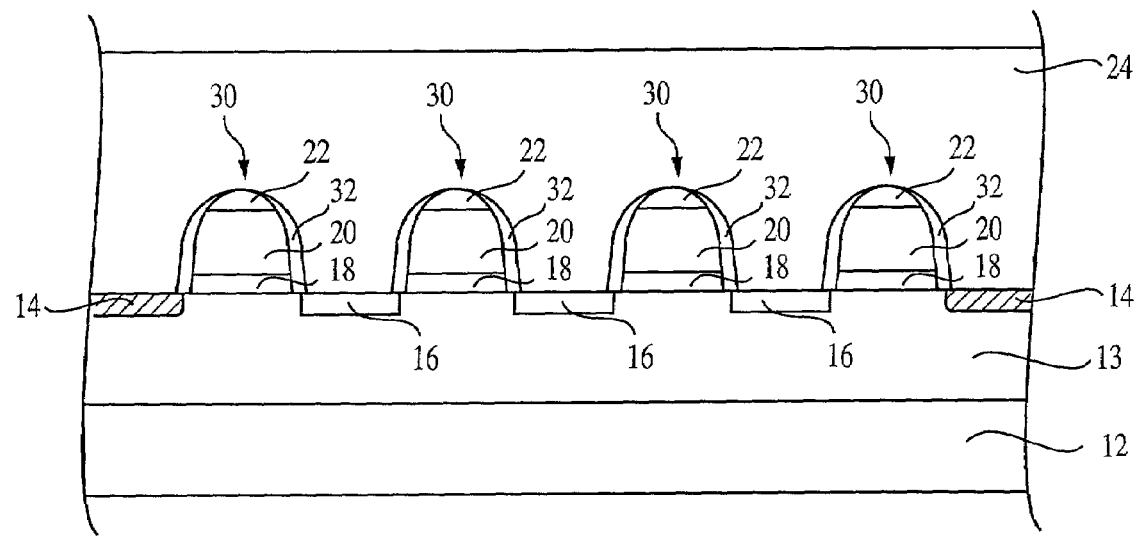
FIG. 1 is schematic cross-sectional view of a portion of a memory DRAM device, in which an upper capacitor platinum electrode will be formed according to an exemplary embodiment of a method of the present invention.

Referring now to the drawings, where like elements are designated by like reference numerals, FIG. 1 depicts a memory cell construction for a DRAM at an intermediate stage of the fabrication, in which a pair of memory cells having respective access transistors are formed on a substrate 12. The memory cell of FIG. 1 will include a capacitor 100 (FIG. 9), which will employ an upper capacitor electrode formed of a noble metal patterned by a method of the present invention.

The FIG. 1 structure includes the substrate 12 having a well 13, which is typically doped to a predetermined conductivity, for example p-type or n-type depending on whether NMOS or PMOS transistors will be formed therein. The structure further includes field oxide regions 14, conventional doped active areas 16 for use as source/drain regions, and a pair of gate stacks 30, all formed according to well-known semiconductor processing techniques. The gate stacks 30 include an oxide layer 18, a conductive layer 20, such as doped polysilicon, nitride spacers 32 and a nitride cap 22.

Above the gate oxide region 18, the polysilicon gates 20, and the protective nitride regions 22, 32, a first insulating layer 24 (FIG. 1) is disposed. Insulating layer 24 could be, for example, silicon oxide ($SiO_2$), borophosphosilicate glass (BPSG), borosilicate glass (BSG), or phosphosilicate glass (PSG).

Figure 2:
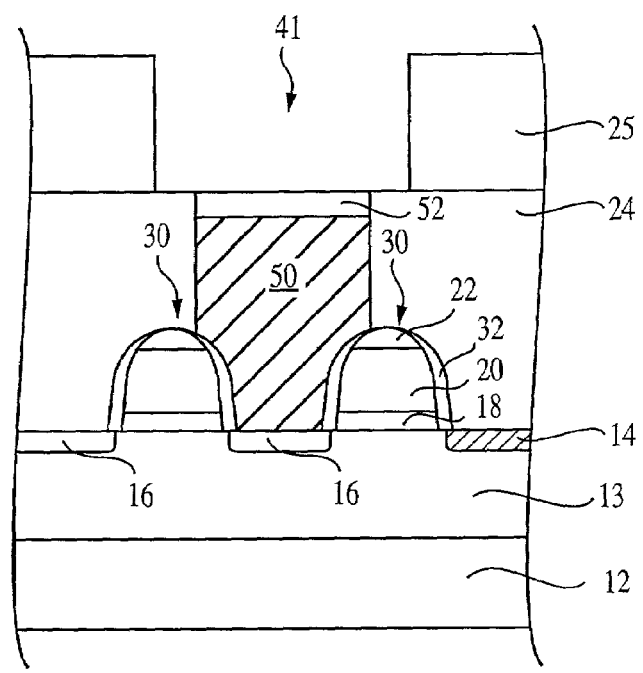
FIG. 2 is a schematic cross-sectional view of the FIG. 1 device at a stage of processing subsequent to that shown in FIG. 1.

Reference is now made to FIG. 2, which for simplicity illustrates only a lateral portion, for example the right side portion, of FIG. 1. This is a region where a contact plug 50 (FIG. 2) and an overlying capacitor structure 100 (FIG. 9), including an upper platinum electrode formed according to a method of the present invention, will be formed. To create the contact plug 50 (FIG. 2), a first contact opening is formed by using conventional photolithography and etching steps in insulating layer 24. The first contact opening extends to a source/drain region 16 provided in well 13 of substrate 12.

Next, the first contact opening (not shown) formed into the first insulating layer 24 is filled with a conductive material, such as doped polysilicon, that is planarized down to or near the planar surface of the first insulating layer 24, to form a polysilicon plug or filler 50, as illustrated in FIG. 2. The polysilicon plug 50 is then anisotropicaily etched until its top surface is recessed below the planar surface of the first insulating layer 24, so that a barrier layer 52 (FIG. 2) can be deposited and planarized, as shown in FIG. 2. The barrier layer 52, preferably of titanium (Ti), is formed on the polysilicon plug 50 by CVD, PVD, sputtering or evaporation, to a thickness of about 60 to about 200 Angstroms. The titanium barrier layer 52 could form titanium silicide ($TiSi_2$) during a later high temperature anneal.

Although the present invention is described herein with reference to forming a capacitor 100 (FIG. 9) over the polysilicon plug 50, including the barrier layer 52, it must be understood that the existence of the barrier layer 52 is optional, and the present invention also applies to capacitors formed over polysilicon plugs without a protective barrier layer 52.

FIG. 2 also depicts a second insulating layer 25 which is next deposited over the barrier layer 52 and the first insulating layer 24. The second insulating layer 25 could be, for example, silicon oxide ($SiO_2$), borophosphosilicate glass (BPSG), borosilicate glass (BSG), phosphosilicate glass (PSG), or tetraethylortho silicate (TEOS). Again, using the same fabrication technique as the one used for the formation of the first contact opening (not shown) through the first insulating layer 24, a second contact opening 41 (FIG. 2) is formed through the second insulating layer 25.

Figure 3:
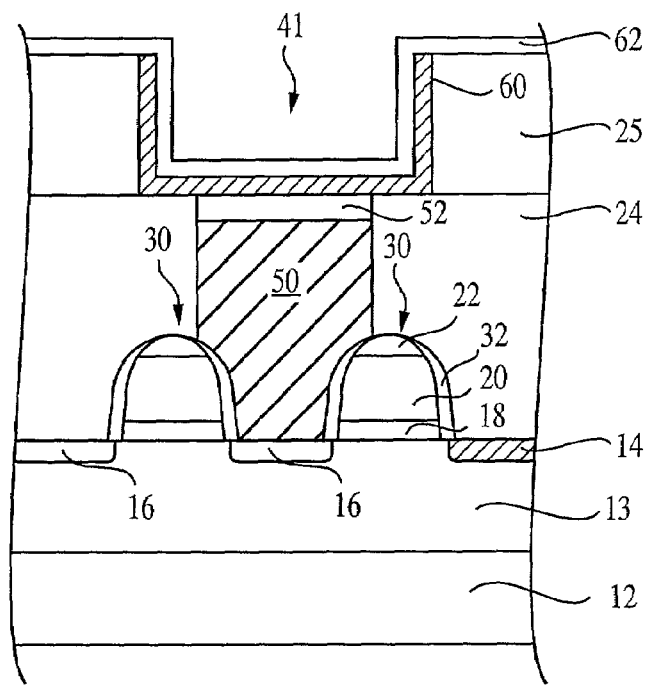
FIG. 3 is a schematic cross-sectional view of the FIG. 1 device at a stage of processing subsequent to that shown in FIG. 2.

Reference is now made to FIG. 3. After the formation of second contact opening 41 of FIG. 2, a lower capacitor electrode 60 is formed into the second contact opening 41, as shown in FIG. 3.

The lower capacitor electrode 60 (FIG. 3) may be formed, for example, of a layer of conductive material, formed into the second contact opening 41 and over the second insulating layer 25, which is then patterned and etched or planarized according to well-known methods of the prior art. The layer of conductive material (not shown) can be formed into the second contact opening 41 and overlying the second insulating layer 25 by any conventional method, such as deposition or sputtering, to a thickness of approximately 50 to 300 Angstroms, more preferably of about 100 Angstroms. The lower capacitor electrode 60 (FIG. 3) may be formed of a noble metal, such as platinum (Pt) or iridium (Ir), or of any other suitable conductive material, such as a conventional metal or doped polysilicon.

Also shown in FIG. 3, a dielectric layer 62 is then formed over the lower capacitor electrode 60 and the second insulating layer 25 by conventional methods, for example, deposition or spin coating, to a thickness of about 100 Angstroms. Increasingly popular materials for the dielectric layer 62 are the ferroelectrics, such as PZT (lead (Pb) zirconate titanate) or $BaTiO_2$ (barium titanite). However, other conventional insulating materials, such as silicon oxides, silicon nitrides, silicon oxynitrides or carbides, may be used also, in accordance with the processing requirements and the characteristics of the particular IC device. Further, high-dielectric constant materials, such as titanium oxide ($TiO_2$) barium oxide (BaO) tantalum oxide ($Ta_2O_5$) or ruthenium oxide ($Ru_2O_3$), may be used also, again according to the characteristics of the particular IC devices to be constructed at subsequent steps.

Figure 4:
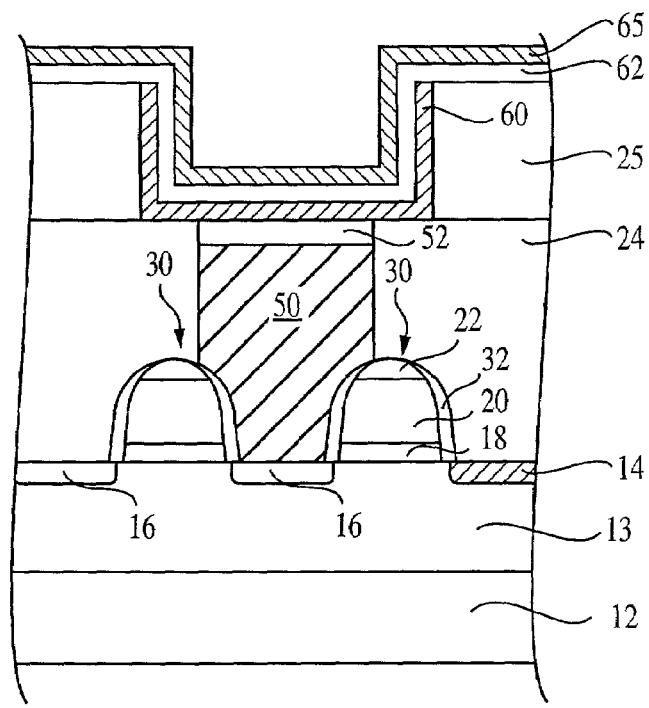
FIG. 4 is a schematic cross-sectional view of the FIG. 1 device at a stage of processing subsequent to that shown in FIG. 3.
Figure 9:
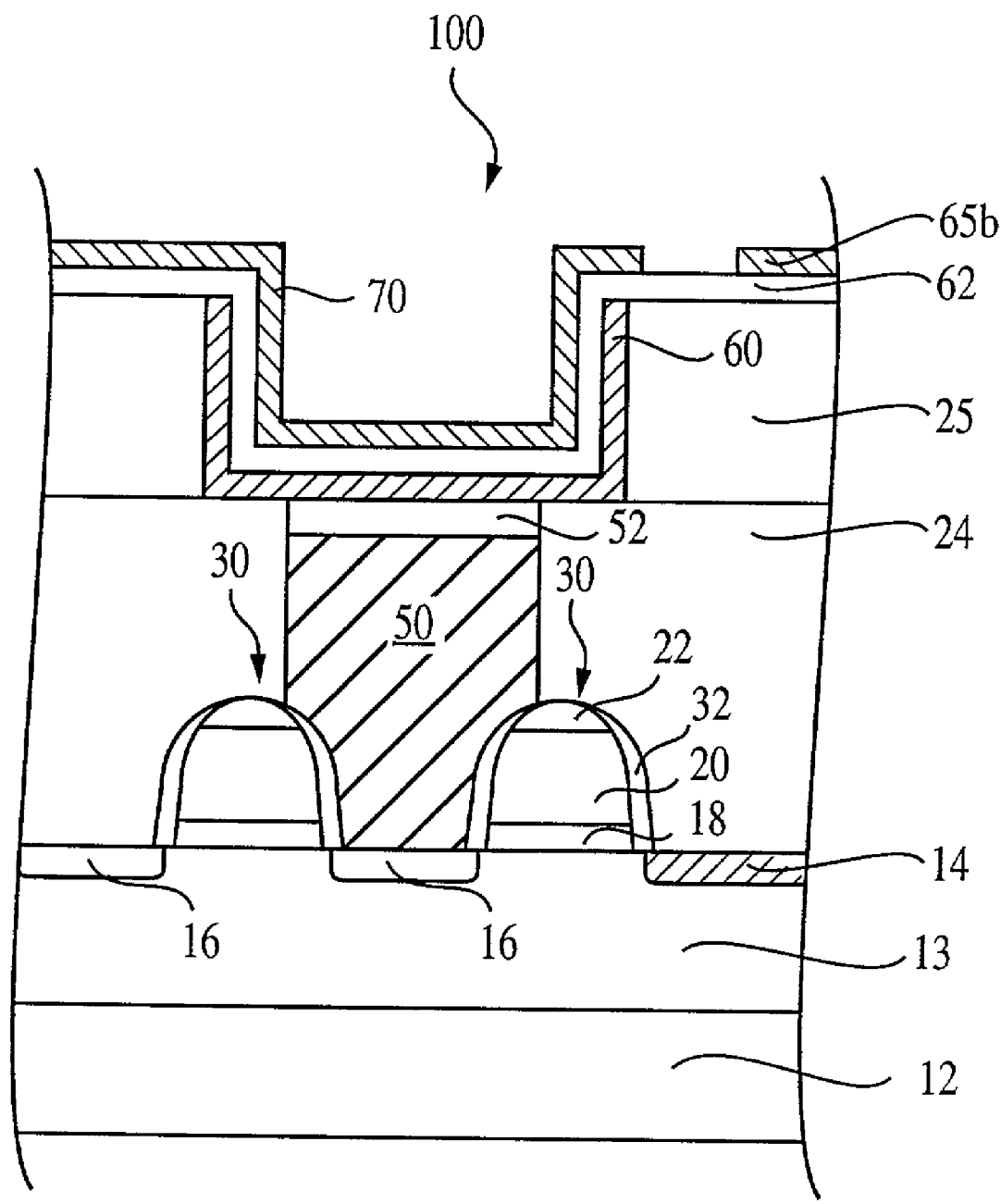
FIG. 9 is a schematic cross-sectional view of the FIG. 1 device at a stage of processing subsequent to that shown in FIG. 8.

After the formation of the dielectric layer 62 (FIG. 3), a noble metal layer 65 is formed over the dielectric layer 62, as shown in FIG. 4. Although any of the eight noble metals and their alloys and oxides mentioned above may be used for forming the noble metal layer 65, platinum is preferred and, thus, further reference to the noble metal layer 65 will be made as to platinum layer 65. After undergoing patterning according to a method of the present invention, platinum layer 65 will form an upper platinum electrode 70 (FIG. 9) of capacitor 100 (FIG. 9).

Platinum layer 65 (FIG. 4) could be formed over the dielectric layer 62 by any conventional method, such as deposition or sputtering, to a thickness of approximately 50 to 300 Angstroms, more preferably of about 100 Angstroms.

Figure 5:
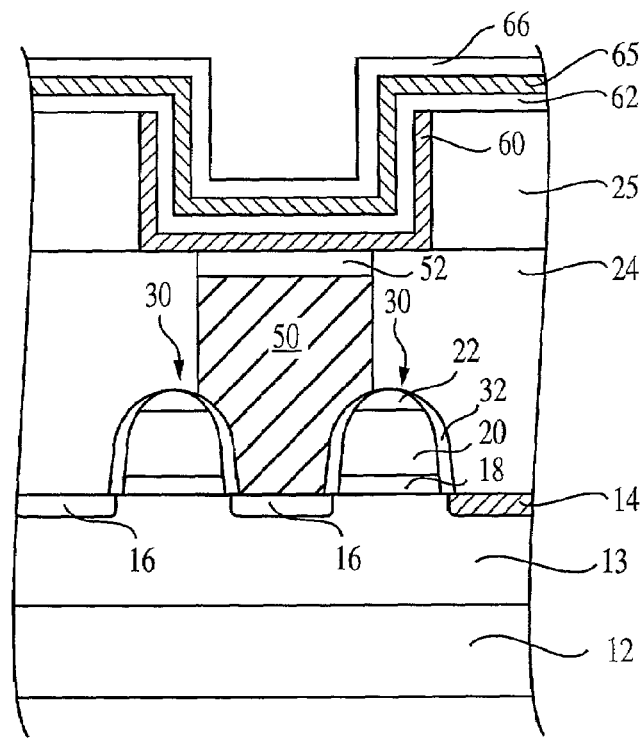
FIG. 5 is a schematic cross-sectional view of the FIG. 1 device at a stage of processing subsequent to that shown in FIG. 4.

Reference is now made to FIG. 5, which illustrates a protective layer 66 formed overlying the platinum layer 65. The protective layer 66 is a hard mask material which is easy to etch and may be deposited, for example, by using plasma, reactive sputtering or a conventional chemical vapor deposition, to a thickness of about 100 Angstroms. Preferred materials for the protective layer 66 are low silane oxide, silicon oxide, silicon, titanium nitride, titanium, tantalum nitride or tantalum, among others. In particular, titanium nitride and tantalum nitride are desirable since they are easy to deposit, they have good step coverage and they adhere well to the platinum layer 65.

Figure 6:
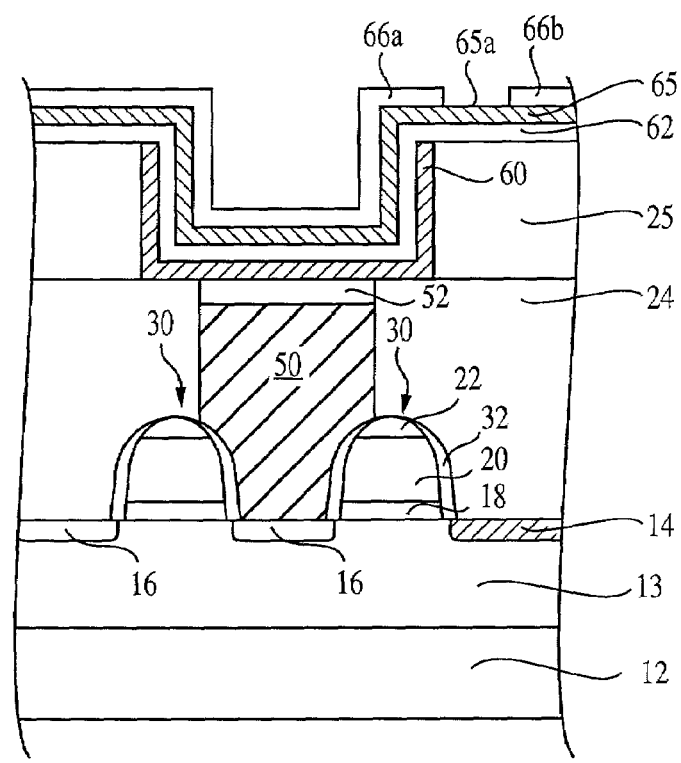
FIG. 6 is a schematic cross-sectional view of the FIG. 1 device at a stage of processing subsequent to that shown in FIG. 5.

Next, the protective layer 66 is patterned by well-known photolithography processes to form a predetermined pattern which corresponds to that of a desired finished upper capacitor electrode, as illustrated in FIG. 6. This way, protective region 66a corresponds to upper platinum electrode 70 (FIG. 9), while region 66b corresponds to an upper capacitor electrode of an adjacent capacitor (not shown) which could be also formed within the second insulating layer 25 in a manner similar to that of forming the capacitor 100 (FIG. 9). The patterning of the protective layer 66 leaves a portion 65a of the platinum layer 65 exposed, as illustrated in FIG. 6.

Figure 7:
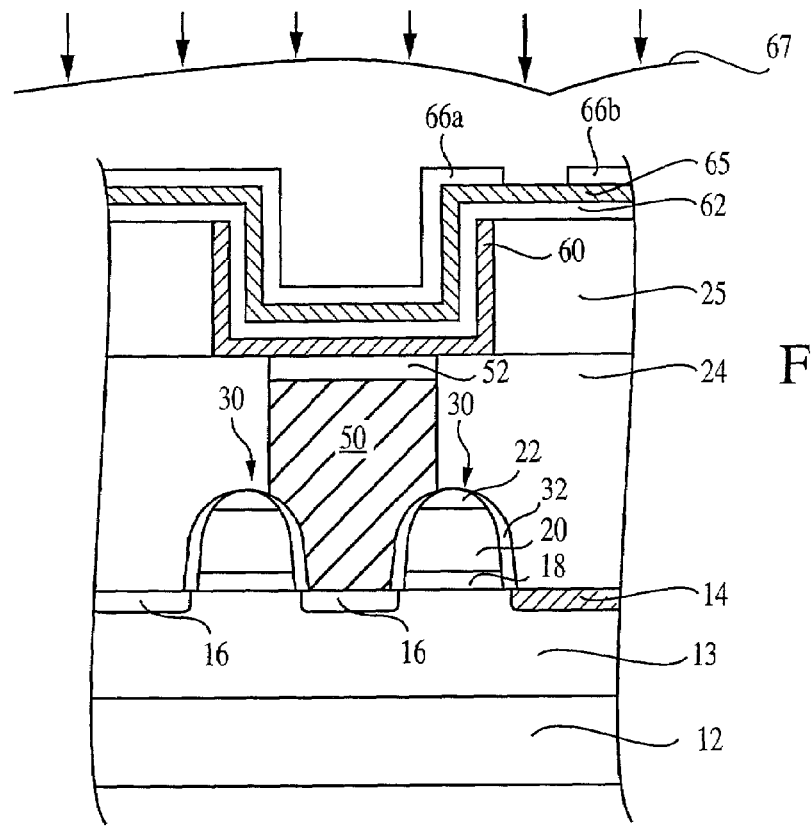
FIG. 7 is a schematic cross-sectional view of the FIG. 1 device at a stage of processing subsequent to that shown in FIG. 6.
Figure 8:
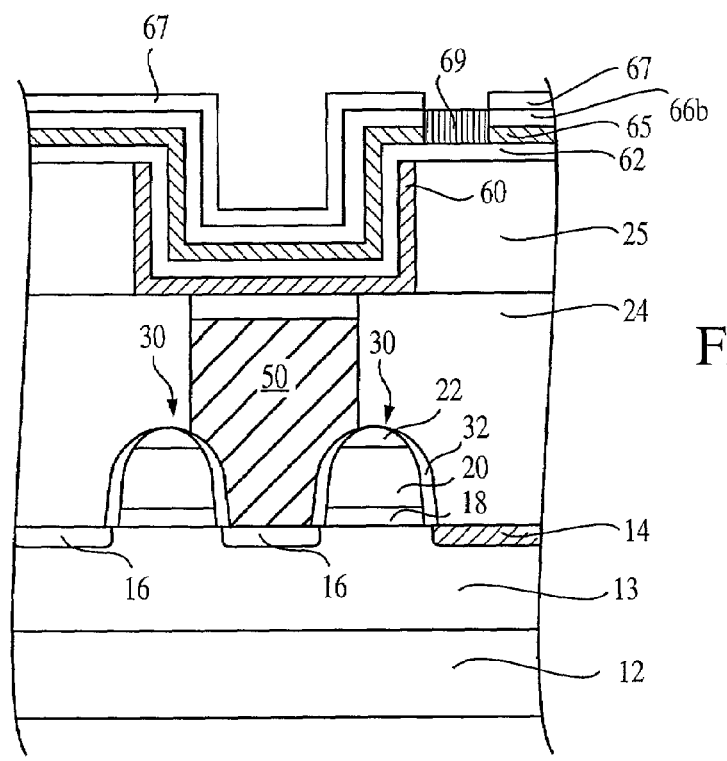
FIG. 8 is a schematic cross-sectional view of the FIG. 1 device at a stage of processing subsequent to that shown in FIG. 7.

In FIGS. 7–8, a blanket silicon film 67, such as polysilicon, for example, is formed on the entire structure of FIG. 6 by conventional deposition methods, for example, a low pressure chemical vapor deposition (LPCVD) process at an anneal temperature of approximately 400° C. to 600° C., more preferably of about 450° C. This way, silicon from the silicon film 67 reacts with platinum from the exposed platinum region 65a of the platinum layer 65, to form a platinum silicide ($Pt_2Si$) 69, as illustrated in FIG. 8. For higher anneal temperatures, for example of about 500° C., platinum is converted to a different form of platinum silicide, that is PtSi, and not $Pt_2Si$, which characterizes lower temperature anneals. In any event, the platinum silicide 69 is then etched by using a dry etch (for example an isoptropic dry etch using a fluorine containing gas) or a wet etch (for example $H_2O_2$ and $H_2SO_4$ at a 10:1 volume ratio) to obtain the upper platinum electrode 70, illustrated in FIG. 9. This way, capacitor 100 (FIG. 9) is formed of the lower capacitor electrode 60, the dielectric layer 62, and the upper platinum electrode 70. To this end, further well-known processing steps to create a functional memory cell containing the capacitor 100 (FIG. 9) may now be carried out.

Figure 10:
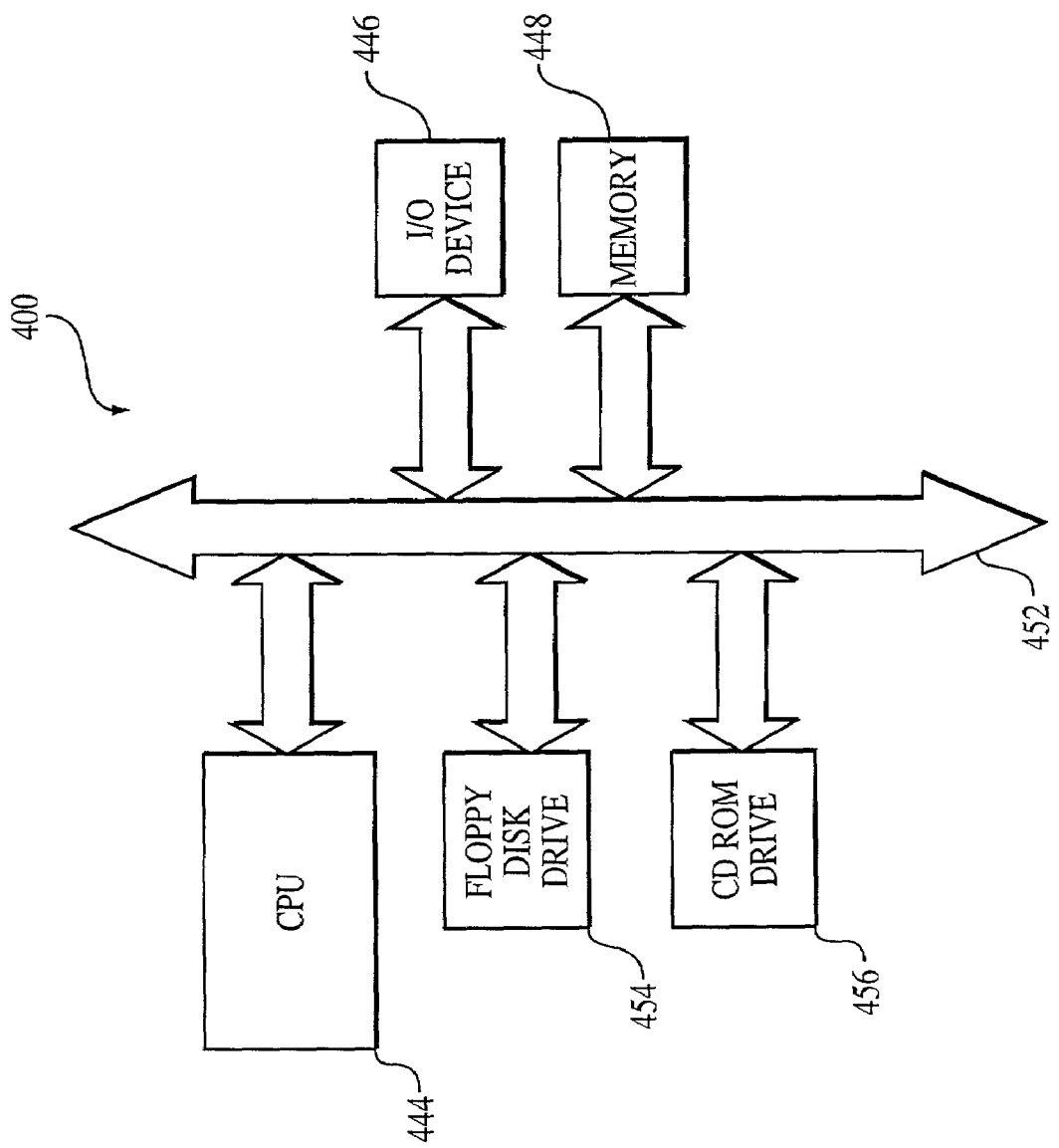
FIG. 10 is an illustration of a computer system having a memory device with a capacitor having an upper platinum electrode formed in accordance with an embodiment of the present invention.

A typical processor based system 400 which includes a memory circuit 448, for example a DRAM, SRAM, MCM, containing a capacitor including an upper platinum electrode constructed according to the present invention is illustrated in FIG. 10. A processor system, such as a computer system, generally comprises a central processing unit (CPU) 444, such as a microprocessor, a digital signal processor, or other programmable digital logic device, which communicates with an input/output (I/O) device 446 over a bus 452. The memory 448 communicates with the central processing unit 444 over bus 452.

In the case of a computer system, the processor system may include peripheral devices such as a floppy disk drive 454 and a compact disk (CD) ROM drive 456 which also communicate with CPU 444 over the bus 452. Memory 448 is preferably constructed as an integrated circuit, which includes at least one capacitor having an upper electrodes formed of a noble metal and patterned as previously described with respect to the embodiment described in connection with FIGS. 1–9. The memory 448 may also be combined with the processor, for example CPU 444, on a single integrated circuit chip.

Although the exemplary embodiment described above refers to the formation of an upper platinum electrode as part of the capacitor 100 (FIGS. 1–9), it must be understood that the present invention contemplates the formation of other geometrical noble metal features that form various IC components, for example, patterned wiring, and it is not limited to capacitors. Rather, the present invention contemplates patterning of noble metals by the method described above to form various features as part of any IC device.

Also, although the exemplary embodiment described shows formation of a container capacitor, such as capacitor 100 of FIG. 9, the invention is further applicable to any other type of IC capacitors currently used in the semiconductor industry. As such, the method of the present invention contemplates ferroelectric capacitors, MIM (metal-insulator-metal) capacitors, MIS (metal-insulator-semiconductor)

capacitors or high-dielectric constant capacitors, among others, according to the characteristics of the particular IC device.

Further, although the exemplary embodiment described above refers to platinum as the preferred material for the upper capacitor electrode, as explained above, any of the other seven noble metals and/or their alloys or oxides may be used also and, thus, the invention must not be limited to the use of platinum.

Accordingly, the above description and drawings are only to be considered illustrative of exemplary embodiments which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. An intermediate product for making an integrated circuit, comprising:
    a capacitor including a lower electrode, a dielectric layer, and an upper electrode formed over said dielectric layer, said upper electrode comprising a metal layer; and
    a removable metal silicide element comprising a metal silicide of the metal layer which is laterally adjacent to and disposed in an opening in said metal layer, and is over and in contact with said dielectric layer.

2. The intermediate product of claim 1, wherein said upper electrode contains a material selected from the group consisting of noble metals, noble metal alloys and noble metal oxides.

3. The intermediate product of claim 2, wherein said upper electrode is a noble metal upper electrode.

4. The intermediate product of claim 3, wherein said upper electrode is a platinum upper electrode.

5. The intermediate product of claim 4, wherein said platinum upper electrode has a thickness of approximately 50 to 300 Angstroms.

6. The intermediate product of claim 5, wherein said platinum upper electrode has a thickness of approximately 100 Angstroms.

7. The intermediate product of claim 1, wherein said upper electrode is a noble metal alloy upper electrode.

8. The intermediate product of claim 1, wherein said upper electrode is a noble metal oxide upper electrode.

9. The intermediate product of claim 1, wherein said metal silicide is a noble metal silicide.

10. The intermediate product of claim 1, wherein said metal silicide is a noble metal alloy silicide.

11. The intermediate product of claim 1, wherein said metal silicide is platinum silicide.

12. An intermediate product for an integrated circuit, comprising:
    a first portion of a conductive layer forming at least one electrode;
    a second portion of said conductive layer forming at least one electrode; and
    a removable silicide layer, disposed laterally adjacent to said first and second portions of said conductive layer,
    wherein each of said first and second portions of said conductive layer is an unsilicided conductive material, said removable silicide layer comprises a silicide of said conductive material, and said removable silicide layer is formed in a space between said first and second portions of said conductive layer thereby physically separating said first and second portions of said conductive layer from each other.

13. The intermediate product of claim 12, wherein said conductive material is selected from the group consisting of noble metals, noble metal alloys and noble metal oxides.

14. The intermediate product of claim 12, wherein said conductive layer forms at least one capacitor electrode.

15. The intermediate product of claim 12, wherein said conductive layer forms at least one patterned wiring.

16. The intermediate product of claim 12, wherein the removable silicide layer comprises a noble metal silicide.

17. The intermediate product of claim 12, wherein the removable silicide layer comprises a noble metal alloy silicide.

18. The intermediate product of claim 12, wherein the removable silicide layer is a platinum silicide.

19. An intermediate product for an integrated circuit, comprising:
    an uppermost noble metal layer located over a dielectric layer and a laterally adjacent noble metal silicide portion formed in an opening of said noble metal layer, wherein the noble metal silicide portion acts to physically separate two portions of said noble metal layer, each portion of said noble metal layer forming a respective first upper electrode and second upper electrode of two separate capacitors.

* * * * *